United States Patent
Mayo et al.

(10) Patent No.: US 9,485,870 B2
(45) Date of Patent: Nov. 1, 2016

(54) METHODS FOR TRANSPARENT ENCAPSULATION AND SELECTIVE ENCAPSULATION

(71) Applicant: Apple Inc., Cupertino, CA (US)

(72) Inventors: Sean A. Mayo, San Francisco, CA (US); James H. Foster, Palo Alto, CA (US); Trevor J. Ness, San Francisco, CA (US); Shankar S. Pennathur, San Jose, CA (US)

(73) Assignee: Apple Inc., Cupertino, CA (US)

( * ) Notice: Subject to any disclaimer, the term of this patent is extended or adjusted under 35 U.S.C. 154(b) by 117 days.

(21) Appl. No.: 13/935,250

(22) Filed: Jul. 3, 2013

(65) Prior Publication Data
US 2014/0190930 A1 Jul. 10, 2014

Related U.S. Application Data

(60) Provisional application No. 61/749,165, filed on Jan. 4, 2013.

(51) Int. Cl.
*H01B 13/00* (2006.01)
*H05K 3/28* (2006.01)
*H05K 1/02* (2006.01)

(52) U.S. Cl.
CPC ............ *H05K 3/284* (2013.01); *H05K 1/0209* (2013.01); *H05K 3/288* (2013.01); *H05K 2201/0108* (2013.01); *H05K 2201/10106* (2013.01); *H05K 2203/107* (2013.01); *H05K 2203/1316* (2013.01); *H05K 2203/1476* (2013.01)

(58) Field of Classification Search
CPC ....... H05K 3/284; H05K 1/185; H05K 5/065
USPC ........................................ 216/13, 14, 19, 20
See application file for complete search history.

(56) References Cited

U.S. PATENT DOCUMENTS

| | | | | |
|---|---|---|---|---|
| 2009/0152707 A1* | 6/2009 | How et al. | .................... | 257/690 |
| 2010/0181582 A1* | 7/2010 | Li et al. | .......................... | 257/91 |
| 2011/0204513 A1* | 8/2011 | Meyer et al. | ................. | 257/738 |
| 2012/0231582 A1* | 9/2012 | Meyer-Berg | .......... | H01L 21/565 438/107 |
| 2012/0235309 A1* | 9/2012 | Essig | .................... | H01L 23/488 257/782 |
| 2013/0154105 A1* | 6/2013 | Do et al. | ....................... | 257/774 |
| 2014/0098505 A1* | 4/2014 | Baker | ........................... | 361/764 |
| 2014/0145325 A1* | 5/2014 | Magnus | ................. | H01L 25/03 257/737 |

OTHER PUBLICATIONS

Wikipedia, the Free Encyclopedia, "Silicone" via http://en.wikipedia.org/wiki/Silicone ; pp. 1-11; 2015.*

(Continued)

*Primary Examiner* — Binh X Tran
(74) *Attorney, Agent, or Firm* — Downey Brand LLP

(57) ABSTRACT

The described embodiments relate generally to electronic devices and more particularly to methods for selectively encapsulating circuit boards and other electronic components contained within electronic devices. A first encapsulation layer can be limited to specific regions of a circuit board using a variety of processes including molding, laser ablation, etching, milling, and the like. Secondary assembly steps can then take place in the regions where the encapsulation layer is removed. In some embodiments, secondary encapsulants having various thermal, electrical, and optical characteristics can fill openings left in the first encapsulation layer to aid in the operation of underlying components.

20 Claims, 9 Drawing Sheets

(56) References Cited

OTHER PUBLICATIONS

Wikipedia, the Free Encyclopedia, "List of thermal conductivities" via http://en.wikipedia.org/wiki/List_of_thermal_conductivities ; pp. 1-14; 2015.*

Zhou et al., "Thermal Properties of Heat Conductive Silicone Rubber Filled with Hybrid Fillers", Journal of Composite Materials, vol. 42, No. 2, 2008 via http://jcm.sagepub.com/content/42/2/173.full.pdf.*

* cited by examiner

A-A

B-B

C-C

C-C

METHODS FOR TRANSPARENT ENCAPSULATION AND SELECTIVE ENCAPSULATION

CROSS REFERENCE TO RELATED APPLICATIONS

This application claims priority to U.S. Provisional Patent Application No.: 61/749,165, filed Jan. 4, 2013, and entitled "METHODS FOR TRANSPARENT ENCAPSULATION AND SELECTIVE ENCAPSULATION," which is incorporated herein by reference in its entirety and for all purposes.

FIELD OF THE DESCRIBED EMBODIMENTS

The described embodiments relate generally to electronic devices and more particularly to methods for selectively encapsulating circuit boards and other electronic components contained within electronic devices.

BACKGROUND

As electronic devices become smaller, the density of electronic components and traces on internal circuit boards increases. Due to this increased density, many circuit boards and modules are encapsulated using a resin designed to protect electronic components from foreign objects, increase reliability, and enable further processing (such as conformal RF shielding). Various methods of encapsulation have been implemented in the electronics industry, including potting, transfer molding, injection molding, conformal coating, and the like.

However, some circuit board designs can be incompatible with standard encapsulation techniques and materials. For example, optical components such as light emitting diodes (LEDs), photo diodes, and ambient light sensors can be rendered unusable when covered by opaque encapsulants along axes of operation. In addition, many conventionally used encapsulants can act as a thermal insulator, restricting the ability of components to disperse heat. Furthermore, encapsulation in certain areas can hinder the ability to form electrical connections between the circuit board and other components or perform rework on an area of the circuit board.

Therefore, what is desired is a way to selectively encapsulate a circuit board such that certain areas can benefit from the encapsulation while other areas can be without an encapsulation layer or can allow optical signals, electrical signals, and thermal energy to pass through the encapsulation layer.

SUMMARY OF THE DESCRIBED EMBODIMENTS

This paper describes various embodiments that relate to methods for selectively encapsulating a circuit board in an electronic device. In one embodiment, a process for selectively encapsulating a circuit board is described. The process can include: (1) encapsulating the circuit board using a first encapsulant, (2) removing the first encapsulant from a first region of the circuit board; and (3) encapsulating the first region of the circuit board using a second encapsulant. In various embodiments, the second encapsulant can be formed from a thermally conductive, electrically conductive, or optically transparent/translucent material to facilitate the operation of underlying electrical components.

According to another embodiment, a method for selectively encapsulating a circuit board can include receiving the circuit board in a mold fixture. The mold fixture defines a first region of the circuit board configured to receive a first encapsulant and a second region of the circuit board configured to be restricted of the first encapsulant. The method can further include encapsulating the first region of the circuit board in the mold fixture using the first encapsulant.

According to another embodiment, a method for selectively encapsulating a circuit board can include receiving the circuit board in a mold fixture. The mold fixture defines a first region of the circuit board configured to receive a first encapsulant and further defines a second region of the circuit board configured to receive a second encapsulant. The method can further include encapsulating the first region of the circuit board in the mold fixture using the first encapsulant, and encapsulating the second region of the circuit board in the mold fixture using the second encapsulant.

According to yet another embodiment, a method for selectively encapsulating a circuit board can include defining a first region of the circuit board with a cutting barrier and a release layer. The release layer is configured to restrict adhering of a first encapsulant to a surface of the circuit board within the first region. The method can further include encapsulating the circuit board and the release layer with the first encapsulant and removing the first encapsulant covering the first region with a cutting process. The cutting process can include a laser cutting process.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

DETAILED DESCRIPTION OF SELECTED EMBODIMENTS

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Several methods are described for selectively encapsulating circuit boards and other electronic components. Some methods are subtractive. Encapsulation can be applied to all surfaces of an electronic assembly. Then, local regions of the assembly can be cleared of encapsulant through the use of laser, milling, or etching techniques. Once the local regions are clear of encapsulant, secondary assembly steps can occur such as mounting components or forming connections to other areas of the device. In some embodiments, secondary encapsulations steps can also be used, providing localized regions employing various encapsulants.

Additional methods are also described that do not require the removal of encapsulant. Regions can be included in the molding design that prohibits certain regions of the circuit board from coming into contact with encapsulant during a first encapsulation process. After the first encapsulation process, these regions are exposed for use in secondary assembly steps. If desired, secondary encapsulation steps can also be performed on the circuit board. The secondary encapsulant can protect components installed during secondary assembly steps or involve different encapsulants from the first encapsulation process.

Figure 1A:
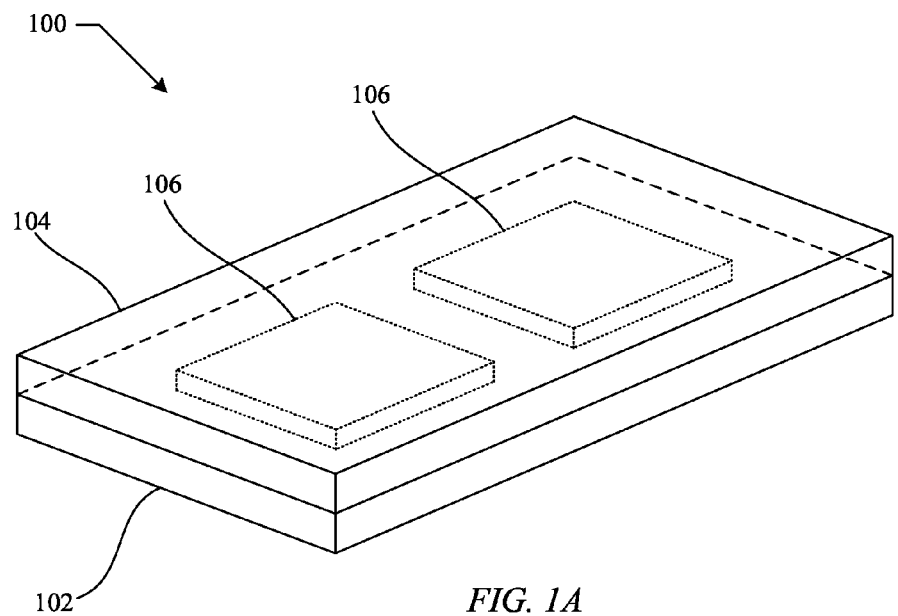
FIG. 1A shows a circuit board module including an encapsulation layer.

FIG. 1A shows a plan view of circuit board module 100. Module 100 can include substrate 102, electronic components 106, and encapsulation layer 104. Substrate 102 can be formed from any material capable of supporting electronic components and traces including fiberglass, aluminum, other composite laminates, and the like. Electronic components 106 can represent integrated circuits, electrical traces, resistors, capacitors, transistors and the like. Encapsulation layer 104 can cover substrate 102, electronic components 106, and any conductive traces overlaid on substrate 102. Encapsulation layer 104 can be formed from a variety of materials, including epoxy, urethane, silicone, acrylic potting compounds, polyester materials, and any other technically feasible material. Furthermore, encapsulation layer 104 can be formed using a variety of techniques such as potting, transfer-mold resin, injection mold-resin, conformal coating, and dip coating. As shown, encapsulation layer 104 covers only one side of substrate 102. However, encapsulation layer 104 can cover all surfaces of substrate 102, including a front, back and side surfaces.

Figure 1B:
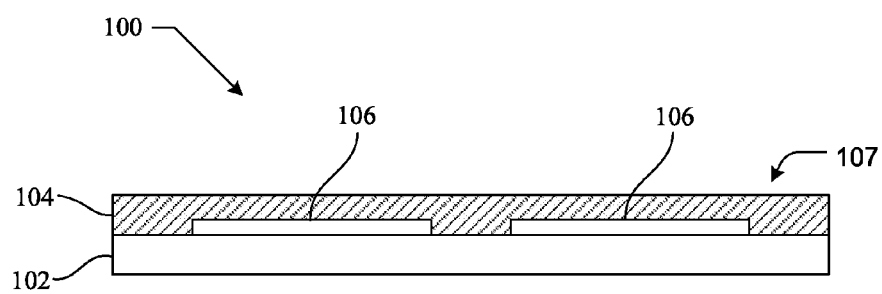
FIG. 1B shows a cross-sectional view of a circuit board module including an encapsulation layer.

FIG. 1B shows a cross-sectional view of circuit board module 100 demonstrating how encapsulation layer 104 can cover electronic components 106. When formed using a molding process, encapsulation layer 104 can have a flat upper surface 107 as is shown in FIG. 1B. However, other techniques such as dip coating can result in an uneven top surface of encapsulation layer 104 that follows a contour created by the various electronic components 106 that are mounted on substrate 102. Often, encapsulation layer 102 is formed from an opaque resin that allows little light to pass through and acts as a thermal and electrical insulator. This can cause design problems when components mounted in certain regions of substrate 102 have optical properties or require thermal or electrical conductivity.

Figure 2A:
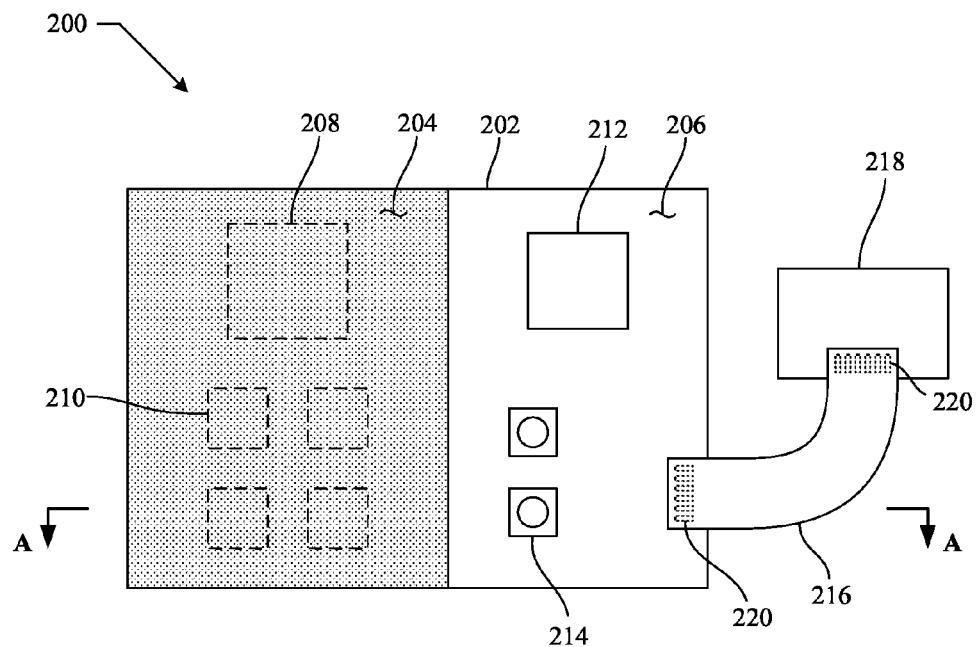
FIG. 2A shows a plan view of a selectively encapsulated circuit board, in accordance with an exemplary embodiment.

FIG. 2A shows circuit board module 200, demonstrating how selective encapsulation can solve many of the above mentioned problems. Substrate 202 can form a base layer for circuit board module 200 and can be formed from a fiberglass resin composite or any other technically feasible materials. Various electrical components and conductive trace can be overlaid on substrate 202. For example, integrated circuits 208 and 210 can represent sensitive circuits that can benefit from encapsulation.

However, circuit board module 200 can also include components that are hindered by encapsulation. For example, component 212 can represent a component that creates a relatively large amount of heat such as a power management unit. Typical encapsulation techniques can limit the ability of component 212 to sufficiently disperse this heat, increasing a risk of failure. Similarly, components 214 can represent optical components such as LEDs, photo diodes, ambient light sensors and the like. Many encapsulants are opaque in color and can inhibit the ability of components 214 to send and receive optical signals. Finally, flex cable 216 can represent an electrical connection between circuit board module 200 and another portion of the device such as a display or drive (i.e., 218). Flex cable 216 can include electrical contacts 220 that are electrically coupled to corresponding contacts on circuit board module 200 using solder or any other technically feasible means. Any electrically insulative encapsulant in the area where flex cable 216 connects to circuit board module 200 can prohibit an electrical connection from being formed.

Figure 2B:
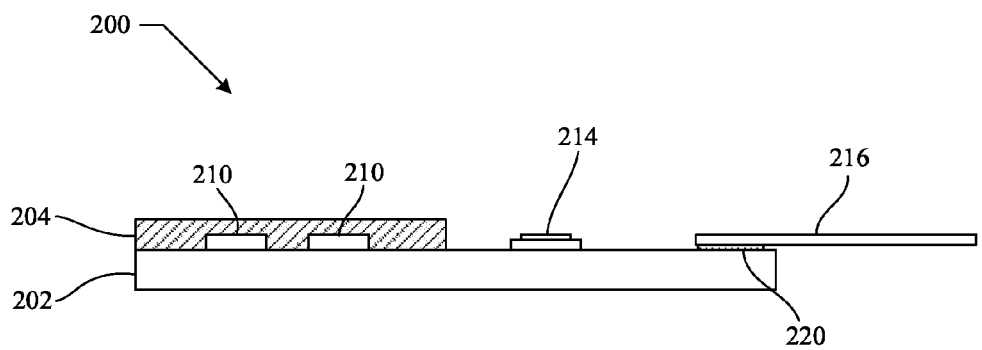
FIG. 2B shows a cross-sectional view of the selectively encapsulated circuit board of FIG. 2A.

The above mentioned problems can be solved by encapsulating only a first region of circuit board module 200. Region 204 can represent an area where encapsulant is applied to protect electrical components 208 and 210, while region 206 can represent an area where no encapsulant is included or where encapsulant is removed. FIG. 2B shows cross section A-A, demonstrating how the encapsulation layer can be limited to region 204 through the methods described herein. As shown, encapsulation layer 204 is applied on one surface of substrate 202. However, in other embodiments, the encapsulation layer can extend to both surfaces of substrate 202 and/or one or more intervening edges.

There are several methods that can be used to selectively apply the encapsulation layer. In one embodiment, both regions 204 and 206 of circuit board module 200 can be encapsulated prior to the installation of components 212 and 214 as well as flex cable 216 and any other components that do not require encapsulation. Then, encapsulant can be removed from region 206 using laser ablation, etching, milling, or any other technically feasible means. Following the removal of encapsulant from region 206, components 212 and 214, and flex cable 216 can be installed in a secondary assembly process. In another embodiment, circuit board module 200 can be encapsulated in a mold designed to restrict encapsulant to region 204. For example, the mold may include one or more barriers configured to define region 206 during an encapsulation process. As encapsulant flows over the substrate 202, it is restricted to region 204 by the one or more barriers. According to this embodiment, when initially encapsulated, areas of secondary assembly or encapsulation (i.e., region 206) are already exposed and available for additional processing. This method can alleviate the need for a secondary assembly steps in some instances where the mold can be designed to accommodate components already assembled in region 206. It is noted that although shown as substantially rectangular, regions 204 and 206 may take any desired or feasible shape without departing from the scope of the present disclosure.

Figure 3A:
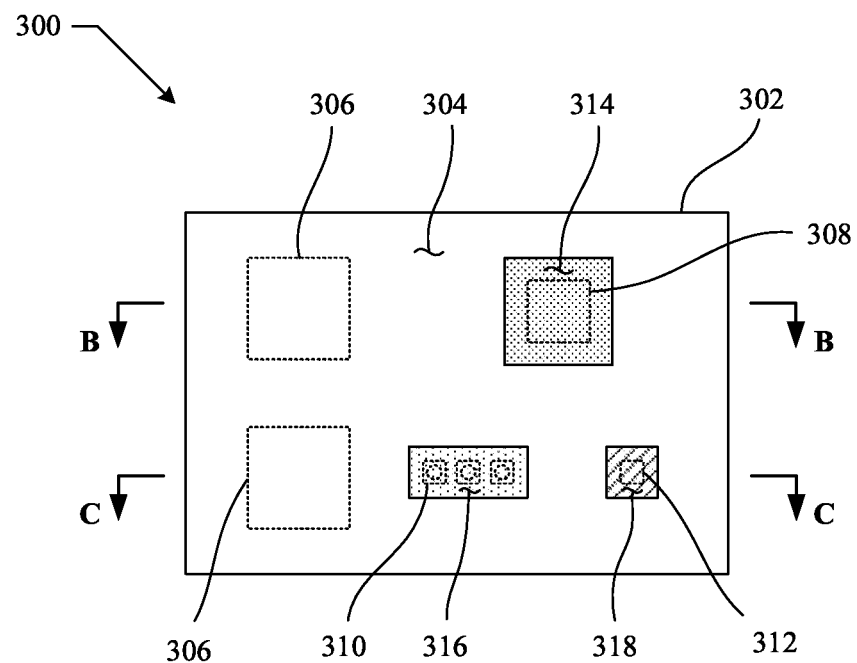
FIG. 3A shows a plan view of a selectively encapsulated circuit board including secondary encapsulants, in accordance with an exemplary embodiment.

FIG. 3A shows a plan view of circuit board module 300, demonstrating another embodiment of the present disclosure. Circuit board module 300 can include various electronic components and electrical traces overlaid on substrate 302. Integrated circuits 306 can represent components that can benefit from encapsulation using an opaque and electrically and thermally insulative encapsulant. Component 308 can represent a relatively hot component such as a power management unit that can benefit from increased thermal conductivity. Components 310 can represent a variety of optical components such as LEDs, photo diodes, and ambient light sensors that can benefit from a protective layer this is optically transparent. Finally, contact 312 can represent an electrically conductive region including one or more electrical contacts that can send electrical signals through an encapsulation layer.

Various types of encapsulants can be used to accommodate the needs of different components included in circuit board module 300. Region 304 can include a conventional encapsulant such as an opaque and electrically insulative epoxy resin. This can provide adequate protection for components 306 and any electrical traces overlaid on substrate 302. Region 314 surrounding thermally active component 308 can be encapsulated using a thermally conductive encapsulant, such as an epoxy including a filler material designed to increase thermal conductivity or the like. According to one embodiment, aluminum oxide may be used as the filler material. Region 318 surrounding conductive contact 312 can be encapsulated using an electrically conductive encapsulant, allowing electrical signals to pass through region 318. Finally, region 316 surrounding optical components 310 can be encapsulated using an optically clear, transparent, or translucent encapsulant such as epoxy, silicone, polyurethane or the like. The optical encapsulant used in region 316 may also have physical properties designed to optically isolate individual components of the optical components 310 while allowing transmission of light external to the encapsulant, in some embodiments. Furthermore, according to one embodiment, the optical encapsulant used in region 316 may include filtering, polarizing, or other optical properties configured to enhance operation of components 310. For example, filtering may allow targeted wavelengths of light to reach the components 310. These and other features may be combined or omitted from the described regions in some implementations. Furthermore, regions 304, 314, 316, and 318 may take any shape other than those particularly shown without departing from the scope of the present disclosure.

Figure 3B:
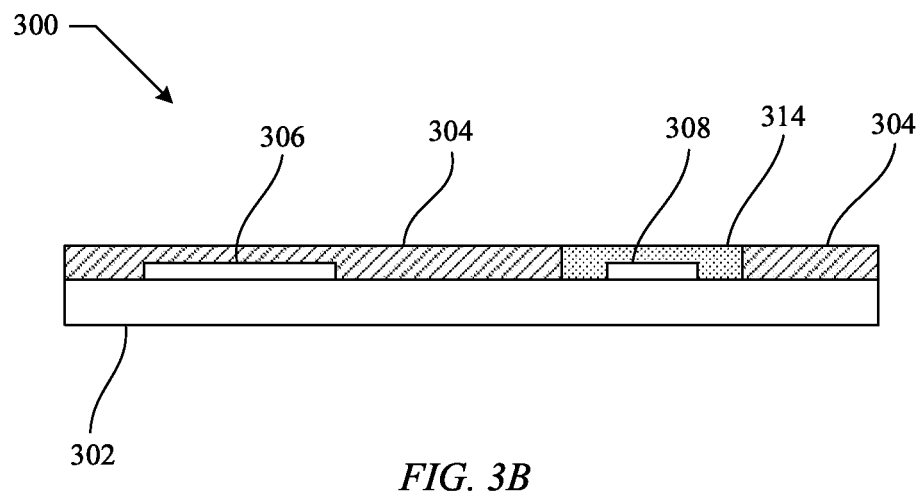
FIG. 3B shows a cross-sectional view of the selectively encapsulated circuit board of FIG. 3A.

FIG. 3B shows cross-sectional view B-B, demonstrating how various encapsulants can be used in a single circuit board module. As is shown, region 304 can contain a conventional encapsulant suitable for protecting component 306 while region 314 can include a thermally conductive encapsulant designed to allow heat from component 308 to dissipate through the encapsulation layer. While regions of encapsulation are only shown on one side of substrate 302, in other embodiments encapsulation layers can be applied to both sides and/or end regions of substrate 302.

Figure 3C:
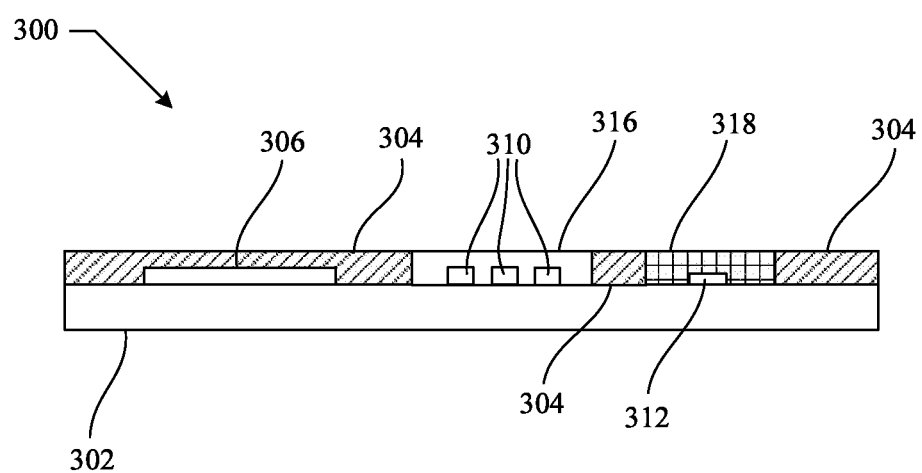
FIG. 3C shows a cross-sectional view of the selectively encapsulated circuit board of FIG. 3A.

FIG. 3C shows cross-sectional view C-C, demonstrating again how various encapsulants can be used in a single circuit board module. As is shown, region 304 can contain a conventional encapsulant suitable for protecting component 306 while region 316 can include an optical encapsulant designed to allow transmission of light. Additionally, region 318 can include a conductive encapsulant allowing transmission of electrical signals. While regions of encapsulation are only shown on one side of substrate 302, in other embodiments encapsulation layers can be applied to both sides and/or end regions of substrate 302.

Various methods can be used to selectively apply the encapsulants shown in FIGS. 3A and 3B. Using a first method, circuit board module 300 can be fully encapsulated using a conventional encapsulant prior to installation of components 308, 310, and 312. Then, the conventional encapsulant can be removed from regions 314, 316, and 318 using laser ablation, etching, milling, or any other technically feasible process. Once the encapsulant is removed, components 308, 310, and 312 can be installed and electrically coupled to substrate 302. Finally, various encapsulants can be applied to regions 314, 316, and 318 based on the needs of the underlying components. For example, region 314 can be covered with a thermally conductive encapsulant, region 316 can be covered with an optically clear encapsulant, and region 318 can be filled with an electrically conductive encapsulant.

In another embodiment, circuit board module 300 can be encapsulated in a mold designed to restrict the application of conventional encapsulant to region 304. For example, encapsulant can be restricted from entering regions 314, 316, and 318 during the molding process. The mold may include one or more barriers configured to define regions 314, 316, and 318 during an encapsulation process. As encapsulant flows over the substrate 302, it is restricted to region 304 by the one or more barriers. Components 308, 310 and 312 can be installed either before or after the encapsulation of region 304. If desired, secondary encapsulation processes can then be carried out in regions 314, 316 and 318 depending on the requirements of the underlying components. In yet another embodiment, a multi-chamber mold can be used to encapsulate multiple regions with different encapsulants during the same molding process. This can save time by eliminating secondary assembly and encapsulation steps.

Figure 4A:
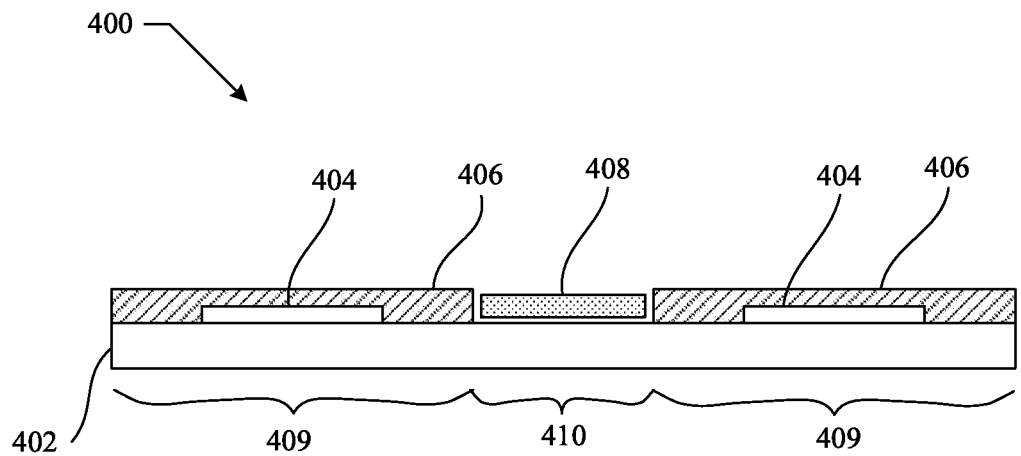
FIG. 4A shows a cross sectional view of a circuit board module with a section of encapsulant removed to increase available volume for components, in accordance with an exemplary embodiment.
Figure 4B:
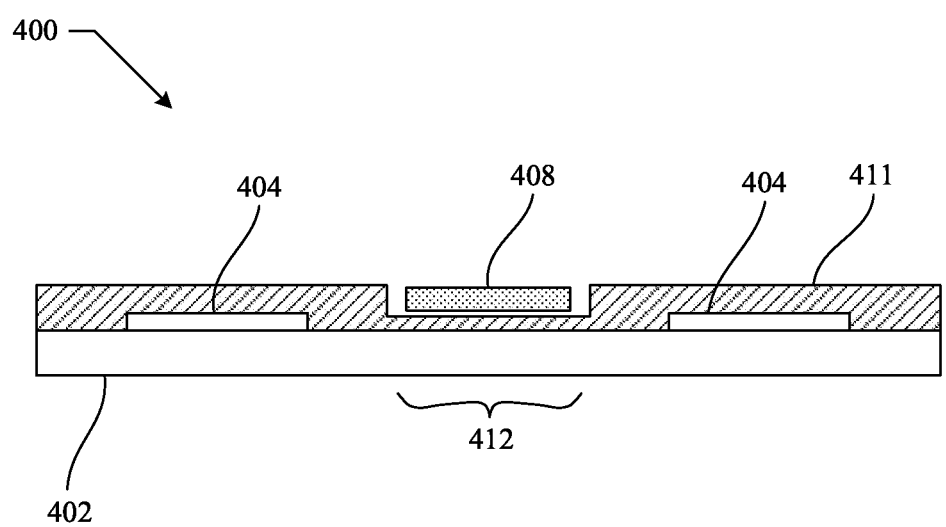
FIG. 4B shows a cross sectional view of a circuit board module with a section of encapsulant removed to increase available volume for components, in accordance with an exemplary embodiment.

FIG. 4A shows a cross-sectional view of circuit board module 400, demonstrating another benefit of selective encapsulation. Due to the decreasing size of many electronic devices, it can be advantageous to design circuit board modules and surrounding components in a manner that utilizes as little volume as possible normal to the circuit board. Circuit board module 400 includes electronic components 404 mounted on substrate 402 and two regions 409 of encapsulation layer 406, with a gap 410 left between the two regions 409 of encapsulation layer 406. In other embodiments, any number of gaps can be created in encapsulation layer 406. The gaps can be used to accommodate other components or structures housed within the electronic device. For example, component 408 can represent a flex cable, internal structural component, or any other component included in the electronic device. By utilizing the gap in encapsulation layer 406, component 408 can be incorporated into the electronic device without increasing the thickness of the electronic device. Gaps in encapsulation layer 406 can be created by removing areas of encapsulation layer 406 or utilizing a mold that does not permit encapsulant to enter the gap region. FIG. 4B shows another embodiment where the thickness of encapsulation 411 is reduced in areas 412 between components 404. The reduced thickness can allow additional clearance for component 408, reducing the thickness of the device, while also allowing some structural support for component 408 from the remnant encapsulant 411 in areas 412.

Figure 5:
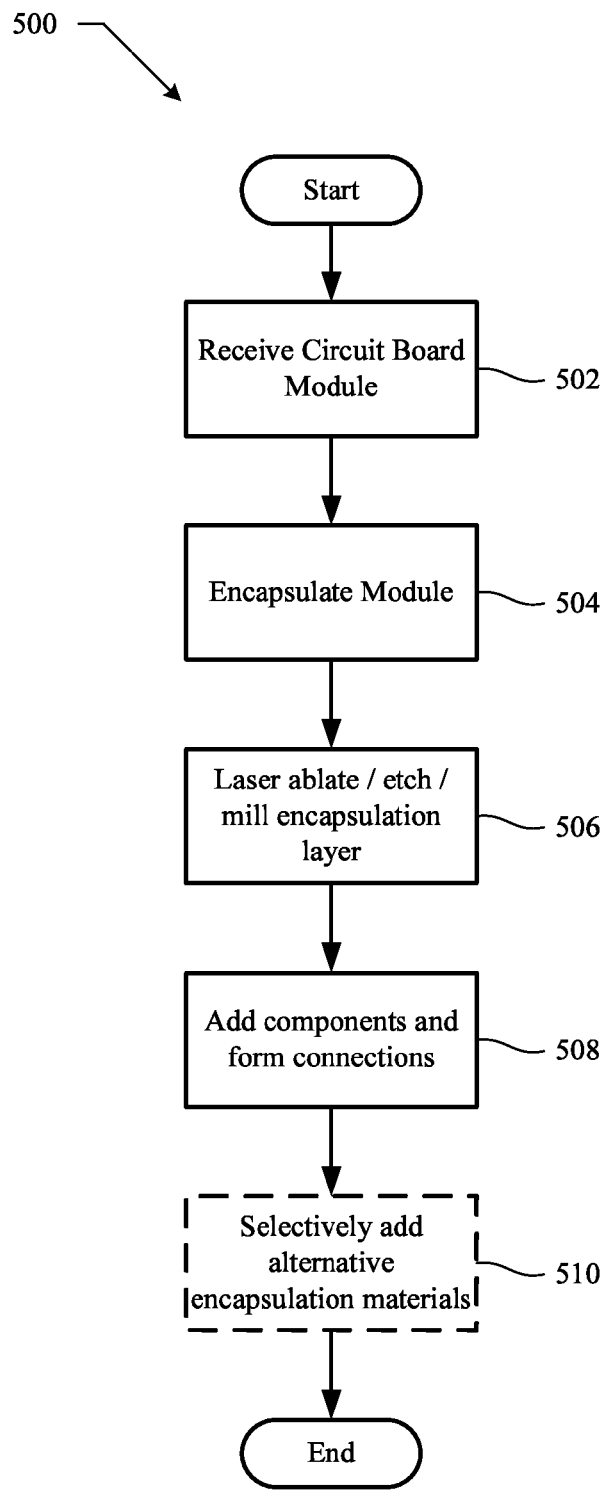
FIG. 5 shows a flow chart describing a process for selectively encapsulating a circuit board, in accordance with an exemplary embodiment.

FIG. 5 shows a flowchart depicting a process 500, demonstrating a method of selectively encapsulating a circuit board module. In step 502, a circuit board module is received. In step 504, the circuit board module can be encapsulated. The encapsulation can be carried out using a variety of processes including potting, transfer molding, injection molding, dip coating, conformal coating, and the like. If a molding process is used, the mold can be configured to apply encapsulant to either the majority of the circuit board module or a portion of the module. In step 506, a portion of the encapsulation layer can be selectively removed using a variety of processes including laser ablation, etching, milling, and the like. Next, in step 508, additional electronic components can be added in the regions where the encapsulation layer was removed in step 506. In addition, connections to other portions of the device can be formed using contacts located in the region where the encapsulation layer was removed. Finally, in optional step 510, the region where the encapsulation layer was removed can be covered with another encapsulation layer using a variety of encapsulants. In one embodiment, the same encapsulant that was used in step 504 can be used again in step 510. In other embodiments, different types of encapsulants can be used. For example, thermally conductive, electrically conductive, or optically clear encapsulants can be used. Such properties may benefit the underlying electrical components added in step 508.

Figure 6:
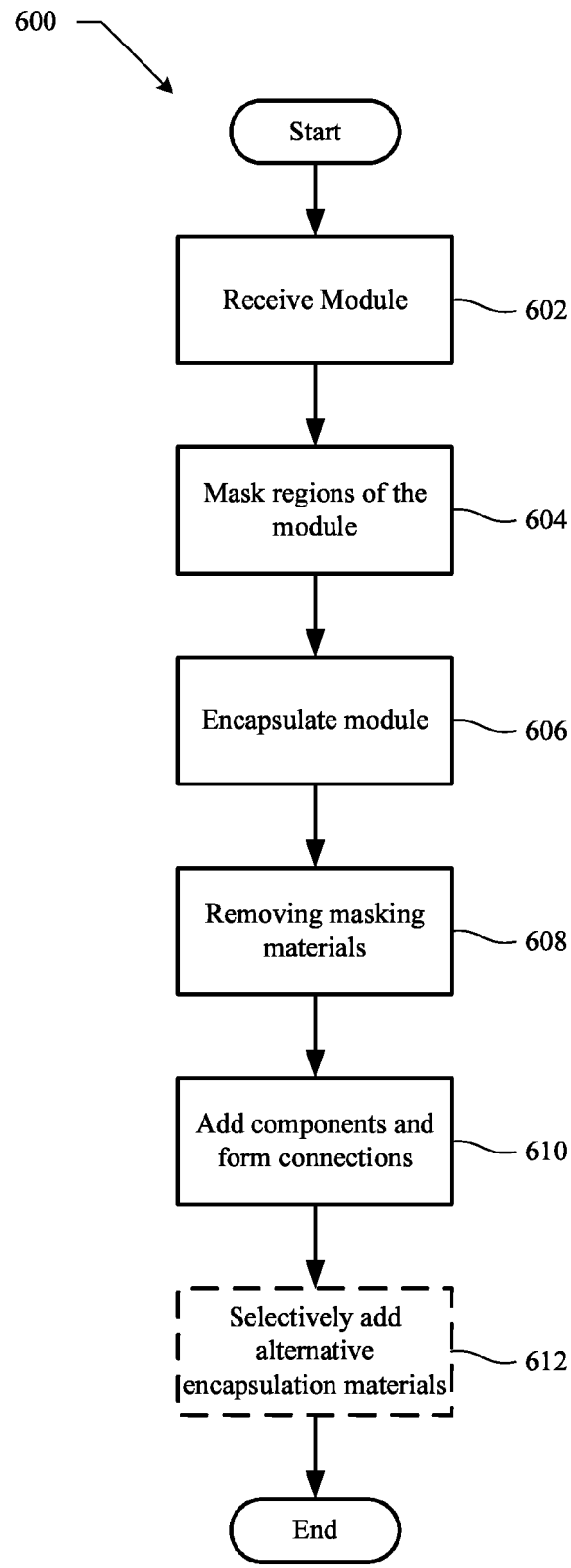
FIG. 6 shows a flow chart describing a process for selectively encapsulating a circuit board, in accordance with an exemplary embodiment.

FIG. 6 shows a flowchart depicting process 600, demonstrating another method of selectively encapsulating a circuit board module. In step 602, a circuit board module is received. In step 604, certain regions of the circuit board module can be masked. In step 606, the circuit board module, including the masking materials, can be encapsulated. The encapsulation can be carried out using a variety of processes including potting, transfer molding, injection molding, dip coating, conformal coating, and the like. If a molding process is used, the mold can be configured to apply encapsulant to either the majority of the circuit board module or a portion of the module. In step 608, the masking material and encapsulation layer covering the masking material can be removed from the circuit board module. Next, in step 610, additional electronic components can be added in the regions where the masking material and encapsulation layer was removed in step 608. In addition, connections to other portions of the device can be formed using contacts located in the region where the encapsulation layer was removed. Finally, in optional step 612, the region where the encapsulation layer was removed can be covered with another encapsulation layer using a variety of encapsulants. In one embodiment, the same encapsulant that was used in step 606 can be used again in step 612. In other embodiments, different types of encapsulants can be used. For example, thermally conductive, electrically conductive, or optically clear encapsulants can be used. Such properties may benefit the underlying electrical components added in step 610.

Figure 7A:
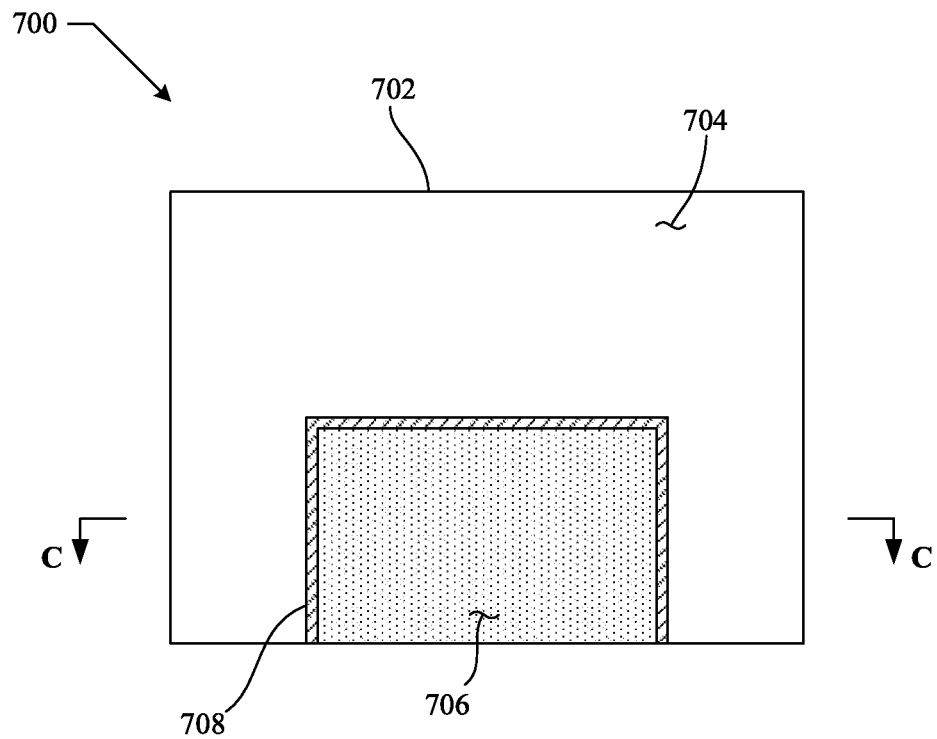
FIG. 7A shows a plan view of a circuit board including a release layer and an encapsulation layer, in accordance with an exemplary embodiment.

FIG. 7A shows a plan view of circuit board module 700, demonstrating an alternative method for removing an encapsulation layer. Substrate 702 can be overlaid with a variety of electronic components and electrical traces. In addition, release layer 706 can be placed over one or more surfaces of substrate 702 in a region where no encapsulation layer is desired. Release layer 706 can be formed from any suitable material that does not allow an encapsulant to penetrate through to circuit board module 700. Cutting/Laser barrier 708 can be located between release layer 706 and substrate 702. Cutting/Laser barrier 708 can be formed from any material capable of temporarily impeding a laser beam such as copper or aluminum, or capable of restricting a cutting process. Furthermore, cutting/laser barrier 708 can be attached to either substrate 702 or release layer 706 prior to assembly. Finally, encapsulation layer 704 can cover both substrate 702 and release layer 706.

Figure 7B:
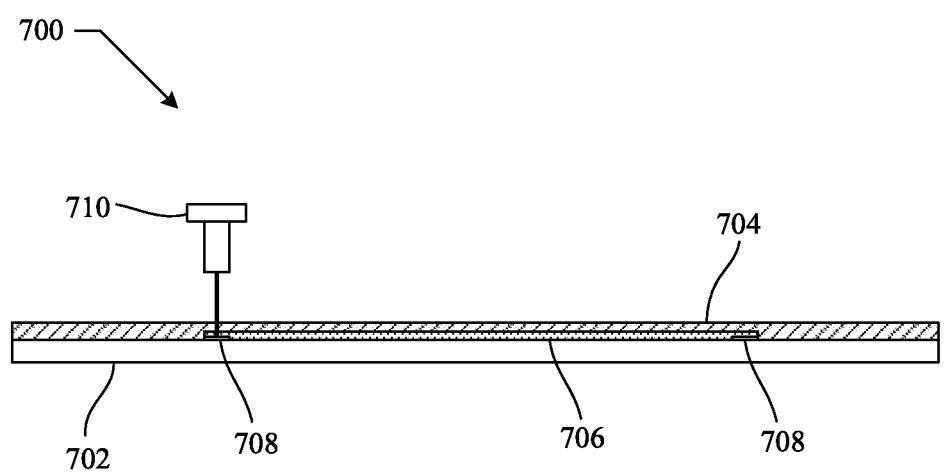
FIG. 7B shows a cross-sectional view of the circuit board of FIG. 7A.

FIG. 7B shows cross-sectional view C-C, demonstrating how a portion of encapsulant can be removed from circuit board module 700. After encapsulation layer 704 is applied, a cutting implement or laser 710 can trace a path along cutting/laser barrier 708. The intensity of laser 710 can be adjusted so that the laser beam can cut through encapsulation layer 704 and release layer 706, but cannot penetrate laser barrier 708. In some embodiments, downward pressure of a cutting implement 710 can be adjusted such that the cutting implement cuts through encapsulation layer 704 and release layer 706 but does not penetrate cutting barrier 708 completely. This can prevent the cutting implement/laser 710 from causing any damage to substrate 702 or any electronic circuitry that is overlaid on substrate 702. After cutting implement/laser 710 has passed along a periphery of release layer 706, release layer 706 and the portion of encapsulation layer 704 attached/adjacent to release layer 706 can be removed from substrate 702. This can allow secondary assembly and encapsulation processes to be carried out in the region where encapsulation layer 704 was removed.

Figure 8:
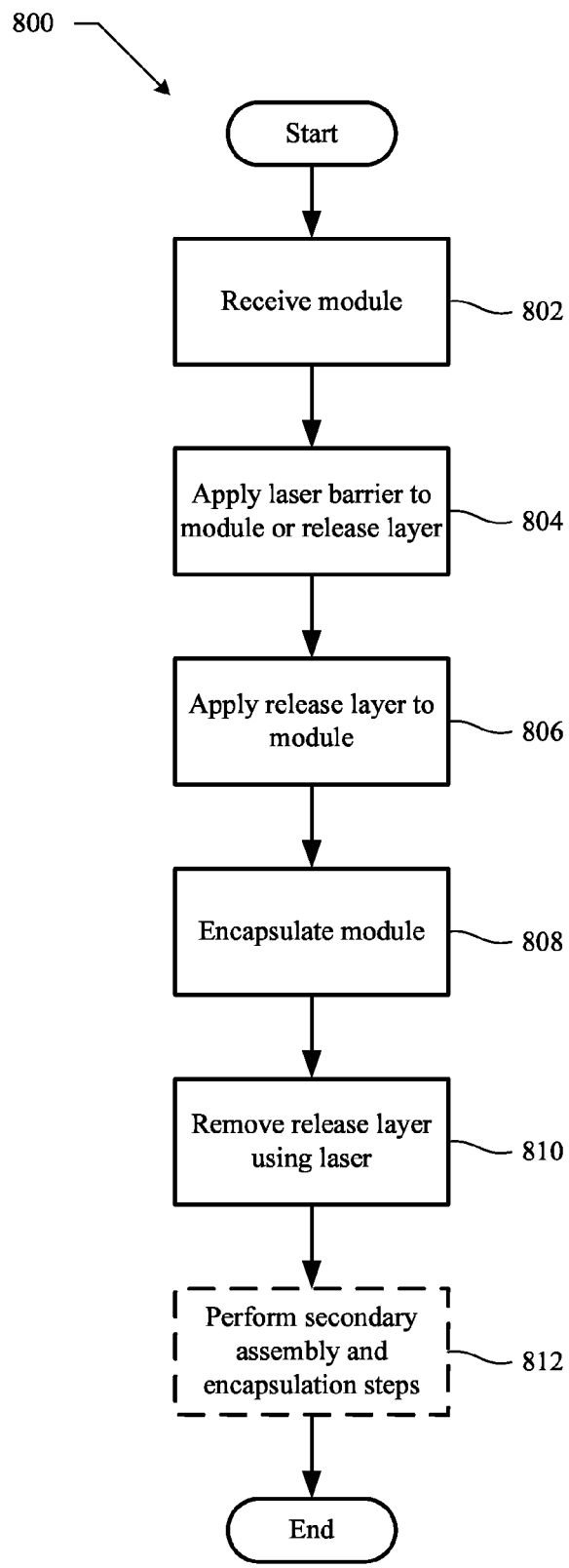
FIG. 8 shows a flow chart describing a process for selectively encapsulating a circuit board, in accordance with an exemplary embodiment.

FIG. 8 shows a flowchart depicting process 800, demonstrating another method of selectively encapsulating a circuit board module using a laser or cutting process as described in FIGS. 7A and 7B. In step 802, a circuit board module is received. In step 804, a cutting/laser barrier can be attached to a surface of the circuit board module. In another embodiment, the cutting/laser barrier can be alternatively attached to a release layer introduced in step 806. In yet another embodiment, the cutting/laser barrier may already be defined and/or attached on the module received at step 802. The cutting/laser barrier can be formed from any material capable of temporarily impeding a laser beam or a cutting process. In step 806, a release layer can be applied to a surface of the module in a region where no encapsulation is desired. The edges of the release layer can approximately align with the cutting/laser barrier. In step 808, the circuit board module and the release layer can be encapsulated. The encapsulation can be carried out using a variety of processes including potting, transfer molding, injection molding, dip coating, conformal coating, and the like. If a molding process is used, the mold can be configured to apply encapsulant to either the majority of the circuit board module or a small portion of the module.

Next, in step 810, a laser or cutting implement can be passed along a periphery of the release material, cutting both the encapsulation layer and the release material. The cutting/laser barrier can prevent the laser or cutting process from causing any damage to the circuit board module. After the laser or cutting implement has cut a periphery around the release layer, the corresponding encapsulation layer can be removed. Finally, in step 812, secondary assembly and encapsulation steps can be performed on the region where the encapsulation layer was removed. In some embodiments, additional electronic components and connections can be formed after the removal of the encapsulation layer. In addition, the region where the encapsulation layer was removed can be covered with a second encapsulation layer using a variety of encapsulants. In one embodiment, the same encapsulant that was used in step 808 can be used again in step 812. In other embodiments, different types of encapsulants can be used. For example, thermally conductive, electrically conductive, or optically clear encapsulants can be used if desired, and/or when such properties benefit the underlying electrical components.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for selectively encapsulating a circuit board having a first surface and a second surface opposite the first surface, the method comprising:
    encapsulating, with a first encapsulant, a first region and a second region of the first surface;
    removing the first encapsulant from the second region;
    adding an electronic component to the second region; and
    encapsulating, with a second encapsulant, the second region of the circuit board, the second encapsulant covering the electrical component.

2. The method as recited in claim 1, wherein the second encapsulant is optically transparent.

3. The method as recited in claim 1, wherein the second encapsulant has increased thermal conductivity relative to the first encapsulant.

4. The method as recited in claim 1, wherein the second encapsulant is electrically conductive.

5. The method as recited in claim 1, wherein the first and the second encapsulants are limited to being included on the first surface.

6. The method as recited in claim 1, wherein the first encapsulant and the second encapsulant are formed of one or more different materials.

7. The method as recited in claim 1, further comprising:
    encapsulating, with the first encapsulant, a third region of the first surface;
    removing another portion of the first encapsulant from the third region of the first surface;
    adding an electronic component to the third region; and
    encapsulating the third region using a third encapsulant.

8. The method as recited in claim 7, wherein the first encapsulant, the second encapsulant, and the third encapsulant are formed of at least one or more different materials.

9. A method for selectively encapsulating a circuit board having a first surface and a second surface opposite the first surface, the method comprising:
    applying a first encapsulant to encapsulate a first region of the first surface;
    adding an electronic component to a second region of the first surface; and
    applying a second encapsulant to the second region to cover the electronic component, wherein the first encapsulant is adjacent to the second encapsulant and boundaries of the second encapsulant are defined by the first encapsulant.

10. The method as recited in claim 9, wherein the first encapsulant is applied to the first region via a mold fixture that isolates the second region from the first encapsulant.

11. The method as recited in claim 9, wherein the second encapsulant is optically transparent.

12. The method as recited in claim 9, wherein the second encapsulant has an increased thermal conductivity relative to the first encapsulant.

13. The method as recited in claim 9, further comprising curing the first encapsulant prior to applying the second encapsulant.

14. The method as recited in claim 9, wherein the first encapsulant and the second encapsulant include one or more different materials.

15. The method as recited in claim 9, further comprising:
    encapsulating a third region of the first surface using a third encapsulant, wherein at least one of the first or the second encapsulant surrounds and defines the third region.

16. The method as recited in claim 15, wherein the first encapsulant, the second encapsulant, and the third encapsulant are formed of at least one or more different materials.

17. A method for selectively encapsulating a circuit board having a first surface and a second surface opposite the first surface, the method comprising:
applying a first encapsulant to encapsulate a first region of the first surface, wherein the first region is isolated from a second region of the first surface by a barrier that prevents the first encapsulant from entering the second region;
adding an electronic component to the second region; and
providing a second encapsulant to encapsulate the second region of the circuit board, the second encapsulant covering the electronic component.

18. The method as recited in claim 17, wherein the first and the second encapsulants are only included on the first surface.

19. A method for selectively encapsulating a circuit board, the method comprising:
defining a first region of the circuit board with a laser barrier and a release layer, wherein the release layer is configured to restrict adhering of a first encapsulant to a surface of the circuit board within the first region;
encapsulating the circuit board and the release layer with the first encapsulant;
removing the first encapsulant covering the first region with a laser cutting process that cuts the first encapsulant adjacent to the laser barrier to define a second region; and
installing an electronic component to the circuit board in the second region.

20. The method as recited in claim 19, wherein the laser barrier is configured to impede a path of a laser beam.

* * * * *